United States Patent
Saito et al.

(10) Patent No.: US 10,866,297 B2
(45) Date of Patent: Dec. 15, 2020

(54) MAGNETIC RESONANCE IMAGING APPARATUS

(71) Applicant: Canon Medical Systems Corporation, Otawara (JP)

(72) Inventors: Kanako Saito, Tokyo (JP); Tomoyuki Takeguchi, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 12 days.

(21) Appl. No.: 16/013,443

(22) Filed: Jun. 20, 2018

(65) Prior Publication Data

US 2018/0372824 A1   Dec. 27, 2018

(30) Foreign Application Priority Data

Jun. 26, 2017   (JP) ................. 2017-124487

(51) Int. Cl.
*G01R 33/56* (2006.01)
*G01R 33/561* (2006.01)
*G01R 33/48* (2006.01)
*G01R 33/54* (2006.01)

(52) U.S. Cl.
CPC ..... *G01R 33/5608* (2013.01); *G01R 33/4824* (2013.01); *G01R 33/561* (2013.01); *G01R 33/546* (2013.01)

(58) Field of Classification Search
None
See application file for complete search history.

(56) References Cited

U.S. PATENT DOCUMENTS

2011/0234222 A1* 9/2011 Frahm ............... G01R 33/4824
                                                                    324/309
2015/0077112 A1    3/2015 Otazo et al.

OTHER PUBLICATIONS

Stefanie Winkelmann, et al., "An Optimal Radial Profile Order Based on the Golden Ratio for Time-Resolved MRI", IEEE Transactions on Medical Imaging, vol. 26, No. 1, Jan. 2007, 9 pages.

* cited by examiner

*Primary Examiner* — Douglas X Rodriguez
(74) *Attorney, Agent, or Firm* — Oblon, McClelland, Maier & Neustadt, L.L.P.

(57) ABSTRACT

According to one embodiment, a magnetic resonance imaging apparatus includes sequence control circuitry. The sequence control circuitry acquires magnetic resonance signals corresponding to each of N spokes (N is a natural number of two or more) which is less than the total number of spokes, and thereafter acquires magnetic resonance signals corresponding to each of the N spokes after the N spokes are rotated while maintaining angles between adjacent spokes.

7 Claims, 9 Drawing Sheets

MAGNETIC RESONANCE IMAGING APPARATUS

CROSS-REFERENCE TO RELATED APPLICATIONS

This application is based upon and claims the benefit of priority from the prior Japanese Patent Application No. 2017-124487, filed Jun. 26, 2017, the entire contents of which are incorporated herein by reference.

FIELD

Embodiments described herein relate generally to a magnetic resonance imaging apparatus.

BACKGROUND

Conventionally, in acquisition of magnetic resonance signals in magnetic resonance imaging apparatuses, there is a method where spokes in k-space for radial sampling are changed in a golden-angle manner. In this case, if consecutive spokes corresponding to the Fibonacci series are selected, approximately uniform coverage in k-space can be achieved.

However, in this method, angles between neighboring spokes never become equal.

DETAILED DESCRIPTION

In general, according to the present embodiment, a magnetic resonance imaging apparatus includes sequence control circuitry. The sequence control circuitry acquires magnetic resonance signals corresponding to each of N spokes (N is a natural number of two or more) which is less than the total number of spokes, and thereafter acquires magnetic resonance signals corresponding to each of the N spokes after the N spokes are rotated while maintaining angles between respective neighboring spokes.

A purpose is to improve image quality of a magnetic resonance image.

The magnetic resonance imaging apparatus according to the present embodiment will be described with reference to the accompanying drawings. In the description below, structural elements having substantially the same functions and configurations will be denoted by the same reference symbols, and a repetitive description of such elements will be given only where necessary.

Figure 1:
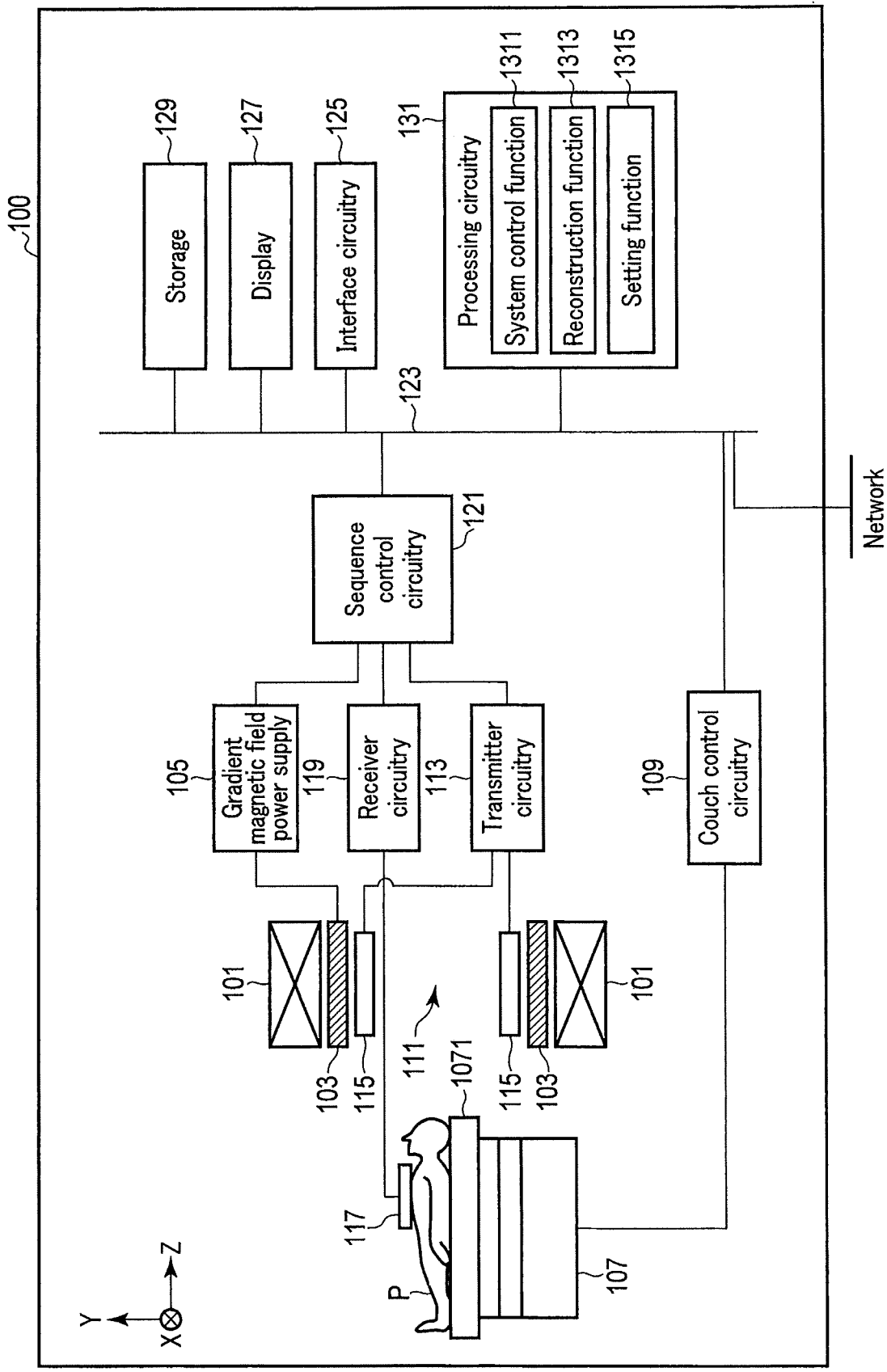
FIG. 1 is a diagram showing the configuration of an MRI apparatus according to the present embodiment.

The configuration of the magnetic resonance imaging (MRI) apparatus according to the present embodiment will be described with reference to FIG. 1. FIG. 1 is a diagram showing the configuration of an MRI apparatus 100 according to the present embodiment. As shown in FIG. 1, the MRI apparatus 100 according to the present embodiment includes a static field magnet 101, a gradient coil 103, a gradient magnetic field power supply 105, a couch 107, couch control circuitry 109, transmitter circuitry (transmitter) 113, a transmitter coil 115, a receiver coil 117, receiver circuitry (receiver) 119, sequence control circuitry (acquisition unit) 121, a bus 123, interface circuitry (input unit) 125, a display (display unit) 127, a storage (storage unit) 129, and processing circuitry (processor) 131. The MRI apparatus 100 may have a hollow cylindrical-shaped shim coil provided between the static field magnet 101 and the gradient coil 103.

The static field magnet 101 is a magnet formed in a hollow and an approximately cylindrical shape. The static field magnet 101 is not necessarily in an approximately cylindrical shape; it may be formed in an open shape. The static field magnet 101 generates a homogeneous static magnetic field in the inner space. For example, a superconductive magnet, etc. is used for the static field magnet 101.

The gradient coil 103 is a coil formed in a hollow cylindrical shape. The gradient coil 103 is arranged inside of the static field magnet 101. The gradient coil 103 is formed by combining three coils respectively corresponding to the X-, Y-, and Z-axes which are orthogonal to each other. The Z-axis direction is defined as the same as the orientation of the static magnetic field. In addition, the Y-axis direction is a vertical direction, and the X-axis direction is a direction perpendicular to each of the Z-axis and the Y-axis. These three coils in the gradient coil 103 are separately supplied with a current from the gradient magnetic field power supply 105, and respectively generate gradient fields in which magnetic field intensity changes along each of the X-, Y-, and Z-axes.

The gradient fields along each of the X-, Y-, and Z-axes generated by the gradient coil 103 respectively correspond to, for example, a slice selective gradient field, a phase encode gradient field, and a frequency encode gradient field (readout gradient field). The slice selective gradient field is used to discretionarily determine an imaging slice. The phase encode gradient field is used to change the phase of magnetic resonance (MR) signals in accordance with a spatial position. The frequency encode gradient field is used to change the frequency of MR signals in accordance with spatial positions.

The gradient magnetic field power supply 105 is a power supply apparatus that supplies a current to the gradient coil 103 by the control of the sequence control circuitry 121.

The couch 107 is an apparatus having the couch top 1071 on which a subject P is placed. The couch 107 inserts the couch top 1071 on which the subject P is placed into the bore 111 under the control of the couch control circuitry 109.

Normally, the couch 107 is installed in an examination room where the MRI apparatus 100 is installed, in such a manner that the longitudinal axis of the couch 107 is parallel to the central axis of the static field magnet 101.

The couch control circuitry 109 is circuitry for controlling the couch 107, and is implemented by a processor, for example. The couch control circuitry 109 drives the couch 107 in response to an operator's instruction via the interface circuitry 125 to move the couch top 1071 in a longitudinal direction and a vertical direction.

The transmitter circuitry 113 supplies a high frequency pulse corresponding to a Larmor frequency to the transmitter coil 115 by the control of the sequence control circuitry 121.

The transmitter coil 115 is an RF (radio frequency) coil disposed inside the gradient coil 103. The transmitter coil 115 receives a high frequency pulse (RF pulse) from the transmitter circuitry 113, and generates transmit RF waves which correspond to a high frequency magnetic field. The transmitter coil is, for example, a whole body (WB) coil. The WB coil may be used as a transmitter/receiver coil.

The receiver coil 117 is an RF coil disposed inside the gradient coil 103. The receiver coil 117 receives MR signals that are emitted from the subject P, caused by the high frequency magnetic field. The receiver coil 117 outputs the received MR signals to the receiver circuitry 119. The receiver coil 117 is, for example, a coil array having one or more coil elements, typically having a plurality of coil elements. In FIG. 1, the transmitter coil 115 and the receiver coil 117 are illustrated as separate RF coils; however, the transmitter coil 115 and the receiver coil 117 may be implemented as an integrated transmitter/receiver coil. The transmitter/receiver coil is, for example, a local transmitter/receiver RF coil, such as a head coil, to serve an imaging target in the subject P.

The receiver circuitry 119 generates digitalized MR signals based on the MR signals output from the receiver coil 117, by the control of the sequence control circuitry 121. Specifically, the receiver circuitry 119 performs various signal processing to the MR signals output from the receiver coil 117, and then performs analog-to-digital (A/D) conversion to the signals subjected to the signal processing.

The receiver circuitry 119 performs sampling to the A/D converted data. The receiver circuitry 119 thereby outputs the digital MR signals (hereinafter, referred to as MR data) to the sequence control circuitry 121.

The sequence control circuitry 121 controls the gradient magnetic field power supply 105, the transmitter circuitry 113, and the receiver circuitry 119, etc. in accordance with an imaging protocol output from the processing circuitry 131, and performs imaging on the subject P. The imaging protocol has different pulse sequences in accordance with a type of examination. In the imaging protocol, defined are a value of a current supplied to the gradient coil 103 by the gradient magnetic field power supply 105, timing of supplying a current to the gradient coil 103 by the gradient magnetic field power supply 105, a magnitude of an RF pulse supplied to the transmitter coil 115 by the transmitter circuitry 113, timing of supplying an RF pulse to the transmitter coil 115 by the transmitter circuitry 113, timing of receiving an MR signal by the receiver coil 117, and the like. A value of a current supplied to the gradient coil 103 by the gradient magnetic field power supply 105 corresponds to a waveform of a readout gradient field in accordance with a pulse sequence.

For example, if a radial scan is performed in accordance with a pulse sequence in which an MR signal is acquired corresponding to each of spokes along radial directions in k-space, the sequence control circuitry 121 controls the gradient magnetic field power supply 105 so as to simultaneously generate a phase encode gradient field and a frequency encode gradient field as a readout gradient field. In addition, the sequence control circuitry 121 controls the gradient magnetic field power supply 105 in such a manner that an intensity of the phase encode gradient field and an intensity of the frequency encode gradient field are changed every time a high-frequency pulse is applied to the transmitter coil 115. Upon generation of a readout gradient field, the sequence control circuitry 121 controls the receiver circuitry 119 to receive MR signals. The sequence control circuitry 121 outputs MR data output from the receiver circuitry 119 along with an intensity and a radial direction (a position filled in k-space) of the readout gradient field to the processing circuitry 131 and the storage 129.

The bus 123 is a transmission path through which data is transmitted between the interface circuitry 125, the display 127, the storage 129, and the processing circuitry 131. Various types of living body signal measuring devices, external storages, modalities, etc. may be connected to the bus 123 via a network, etc., as needed.

The interface circuitry 125 is circuitry for receiving various instructions and information inputs from an operator. The interface circuitry 125 is circuitry for a pointing device, such as a mouse, or for an input device, such as a keyboard, etc. The interface circuitry 125 is not limited to circuitry for physical operation members such as a mouse and a keyboard. The interface circuitry 125 also includes, for example, electric signal processing circuitry that receives an electric signal corresponding to an input operation through an external input device provided separately from the MRI apparatus 100 and outputs the received electric signal to different circuitry.

The display 127, under control of the system control function 1311 in the processing circuitry 131, displays a magnetic resonance image (MR image) reconstructed by the reconstruction function 1313, and an image obtained by performing image processing to an MR image by a non-illustrated image processing function, etc., for example. The display 127 is, for example, a CRT display, a liquid crystal display, an organic EL display, an LED display, a plasma display, any other display known in this technical field, or a monitor, etc.

The storage 129 stores MR data filled in k-space by a reconstruction function 1313, and image data reconstructed by the reconstruction function 1313, etc. The storage 129 stores various imaging protocols, and imaging conditions including imaging parameters that define the imaging protocols, etc. The storage 129 stores programs corresponding to the various functions executed by the processing circuitry 131. The storage 129 is, for example, a RAM (Random Access Memory), a semiconductor memory element such as a flash memory, a hard disk drive, a solid state drive, and an optical disk, etc. The storage 129 may be a drive, etc. configured to read and write various kinds of information with respect to a portable storage medium such as a CD-ROM drive, a DVD drive, or a flash memory, etc.

The processing circuitry 131 includes a non-illustrated processor, and a non-illustrated memory, such as a ROM or a RAM, etc. as hardware resources, to integrally control the MRI apparatus 100. The processing circuitry 131 includes the system control function 1311, the reconstruction function 1313, and a setting function 1315. The various functions, which are performed by the system control function 1311, the reconstruction function 1313, and the setting function 1315, are stored in the storage 129 in a form of a computer-executable program. The processing circuitry 131 is a processor which reads from the storage 129 a program corresponding to each function, and executes the program to activate the corresponding function. In other words, the processing circuitry 131 that has read each program has the functions shown in the processing circuitry 131 of FIG. 1, etc.

FIG. 1 illustrates that the aforementioned functions are implemented by single processing circuitry 131; however, the processing circuitry 131 may include a plurality of independent processors, and the functions may be implemented by the processors executing respective programs. In other words, there may be a case where each of the aforementioned functions may be configured as a program, and single processing circuitry executes each program, or a case where each of the functions may be implemented in independent program-execution circuitry specific to respective functions. The system control function 1311, the reconstruction function 1313, and the setting function 1315 that the processing circuitry 131 has are an example of a system controller, a reconstruction unit, and a setting unit, respectively.

The term "processor" used in the above description means, for example, a CPU (Central Processing Unit), a GPU (Graphics Processing Unit), or circuitry such as an ASIC (Application Specific Integrated Circuit), a programmable logic device (for example, an SPLD (Simple Programmable Logic Device), a CPLD (Complex Programmable Logic Device), or an FPGA (Field Programmable Gate Array)).

The processor reads and executes a program stored in the storage 129 to activate the corresponding function. A program may be directly integrated into the circuitry of the processor, instead of storing the program on the storage 129. In this case, the function is activated by reading and executing the program integrated into the circuitry. Similarly, the couch control circuitry 109, the transmitter circuitry 113, the receiver circuitry 119, and the sequence control circuitry 121, etc. each are also configured as an electronic circuit, such as the processor.

The processing circuitry 131 integrally controls the MRI apparatus 100 by the system control function 1311. Specifically, the processing circuitry 131 reads a system control program stored in the storage 129, deploys the program on a memory, and controls the respective circuitry of the MRI apparatus 100 in accordance with the deployed system control program. For example, by the system control function 1311, the processing circuitry 131 reads an imaging protocol from the storage 129 based on conditions for imaging input by an operator through the interface circuitry 125. The processing circuitry 131 may also generate an imaging protocol based on conditions for imaging. The processing circuitry 131 transmits the imaging protocol to the sequence control circuitry 121 to control imaging on the subject P.

The processing circuitry 131 fills, by activating the reconstruction function 1313, MR data along the readout direction (the radial direction in the case of a radial scan) in k-space. The processing circuitry 131 performs a Fourier transform on the MR data filled in k-space to reconstruct an MR image.

The overall configuration of the MRI apparatus 100 according to the present embodiment has been described above. The processing of setting each of spokes used in a radial scan, and the processing of performing the radial scan by using the set spokes, etc. will be described below.

The processing circuitry 131 sets N spokes in such a manner that angles between neighboring spokes are equal in k-space, by activating the setting function 1315. N is a natural number of two or more, for example, and is set as a default value. In the case where N is an even number, spokes opposed to each other are set in order for equal angular intervals between spokes. Accordingly, in view of acquisition efficiency in k-space, N is preferably an odd number. In addition, N is preferred to be three which is an odd number among natural numbers of two or more, since the time required for a single rotation for spoke acquisition in k-space is the shortest, and spokes are dispersed in k-space with a smaller number of spokes, as described below.

Specifically, the processing circuitry 131 performs, by activating the setting function 1315, recursive division to 360° by N to the j-th power ($N^j$), to set a rotation angle of N spokes which are set to have equal angular intervals in k-space. Here, j is a smallest natural number that makes $N^j$ equal to or greater than the total number of spokes in a radial scan. Specifically, the processing circuitry 131 generates a tree structure that is a balanced tree and a multi-branch tree of N (hereinafter, referred to as a recursive tree), based on the total number of spokes and N, as an example of recursive division to 360°. The total number of spokes and N are parameters concerning recursive tree generation. The processing circuitry 131 directs the storage 129 to store the generated recursive tree. The recursive division to 360° is not limited to a recursive tree.

Figure 2:
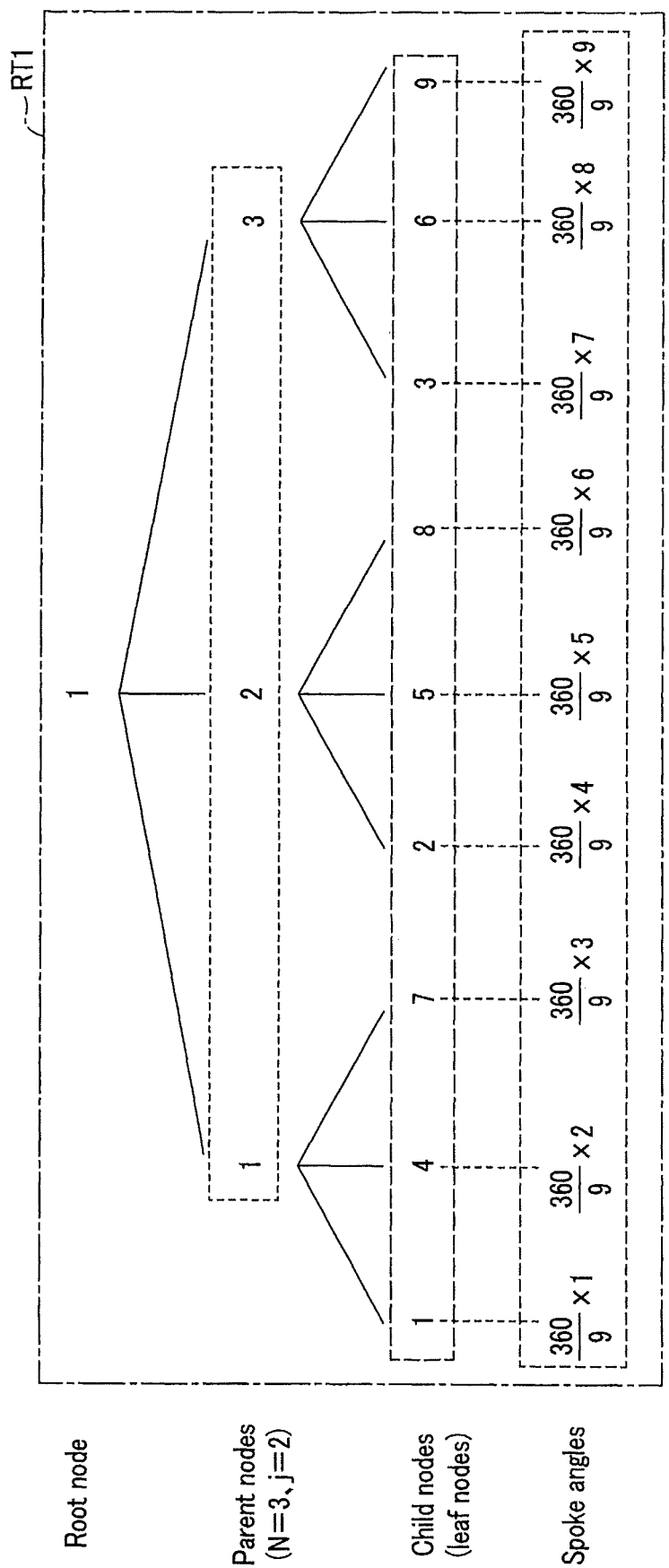
FIG. 2 illustrates a recursive tree where N is three, and the total number of spokes is nine, according to the present embodiment.

A recursive tree where N is three, and the total number of spokes is nine in a radial scan, will be explained as an example of a recursive tree. In this case, j is two. FIG. 2 illustrates a recursive tree RT1 where N is three, and the total number of spokes is nine.

The processing circuitry 131 sets, by activating the setting function 1315, three parent nodes at a lower level of a root node by three branches in the tree structure. The processing circuitry 131 assigns natural numbers of one to three (referred to as first natural numbers) in the ascending order to the set three parent nodes from the left side of the three structure. The processing circuitry 131 sets three child nodes at a lower level of each of the three parent nodes by three branches. The set child nodes correspond to leaf nodes of the recursive tree RT1 shown in FIG. 2. The processing circuitry 131 assigns the first natural number of the corresponding parent node and two natural numbers obtained by sequentially adding three to the first natural number and to the resultant value, to three leaf nodes under the same parent node from the left side, in the ascending order. The natural numbers assigned to the leaf nodes are referred to as second natural numbers. The processing circuitry 131 calculates values by dividing 360° by the total number of spokes and multiplying the resultant values by a number of one to N, respectively. The obtained values correspond to spoke angles relative to a reference axis in k-space. The processing circuitry 131 assigns the calculated angles to each leaf node from the left side of the tree structure in the ascending order. By the aforementioned process, the recursive tree RT1 shown in FIG. 2 is generated. The second natural numbers assigned to leaf nodes in the recursive tree RT1 shown in FIG. 2 correspond to a scanning order of spokes when a radial scan is performed. That is, the processing circuitry 131 assigns different natural numbers (second natural numbers; scanning order) and different spoke angles in k-space to each leaf node at the lowest level of the tree structure.

Figure 3:
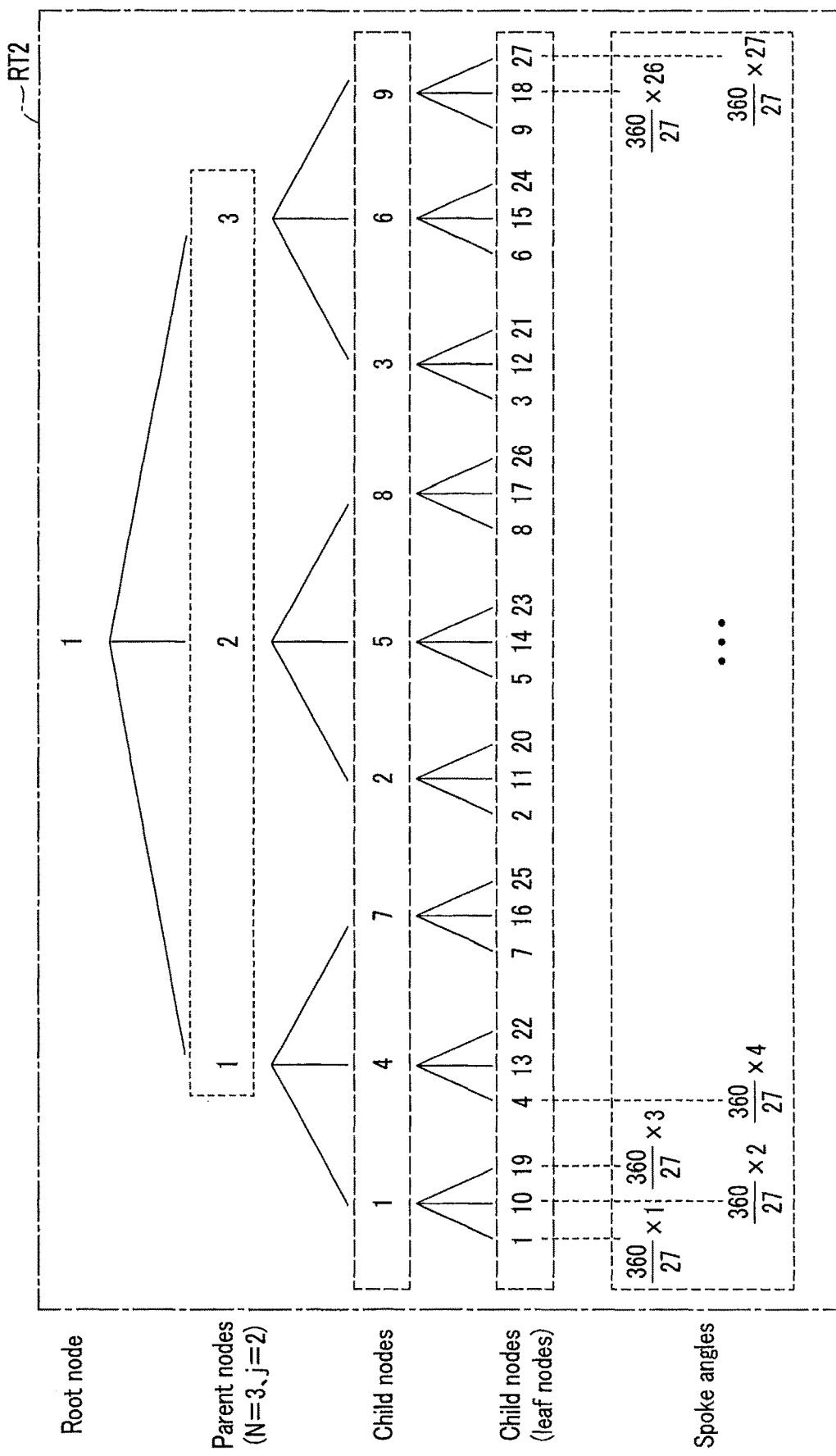
FIG. 3 illustrates a recursive tree where N is three, and the total number of spokes is 27, according to the present embodiment.

The case where child nodes are recursively generated as leaf nodes at a lower level of the child nodes in a recursive tree is explained with reference to FIG. 3. In this case, j is three. FIG. 3 illustrates a recursive tree RT2 where N is three, and the total number of spokes is 27. The process to assign natural numbers of one to nine to child nodes shown in FIG. 3 is the same as that for FIG. 2, and the explanation is omitted.

The processing circuitry 131 sets, by activating the setting function 1315, three child nodes at a lower level of each of the three child nodes by three branches in the tree structure. The set child nodes are child nodes at the lowest level in the tree structure, and correspond to leaf nodes of the recursive tree RT2 shown in FIG. 3. The processing circuitry 131 assigns the first natural number of the corresponding parent node and two natural numbers obtained by sequentially adding the square of three to the first natural number and to the resultant value to three leaf nodes under the same parent node from the left side, in the ascending order. The processing circuitry 131 assigns the calculated angles to each leaf node from the left side in the ascending order. By the aforementioned process, the recursive tree RT2 shown in FIG. 3 is generated. The second natural numbers assigned to leaf nodes in the recursive tree RT2 shown in FIG. 3 correspond to a scanning order of spokes when a radial scan is performed.

The generation of the recursive tree can be generalized as the following process by the processing circuitry 131 that activates the setting function 1315. The processing circuitry 131 sets N parent nodes at a lower layer of a root node in a tree structure. The processing circuitry 131 sets N child nodes at a lower level of each parent node by N branches. The processing circuitry 131 recursively sets child nodes by branches (j−2) times at a lower level of each child node. The processing circuitry 131 assigns the first natural numbers of one to N to the parent nodes from the left side in the ascending order. The processing circuitry 131 assigns from the left side in the ascending order, to N child nodes under the same parent node in which the number of connection branches between the parent node and each of the N child nodes is i (i is a natural number less than j), the first natural number of the corresponding parent node and (N−1) natural numbers obtained by sequentially adding $N^i$ to the first natural number and to the resultant value, the addition of $N^i$ being repeated (N−1) times. The processing circuitry 131 calculates values by dividing 360° by the total number of spokes and multiplying the resultant values by a number of one to N, respectively, as spoke angles in k-space. The processing circuitry 131 assigns the calculated angles to leaf nodes at the lowest level of the tree structure from the left side in the ascending order. The procedure for generating a recursive tree is not limited to the aforementioned method. For example, the processing circuitry 131 may first generate child nodes from a root node, assuming that N is three, then generate child nodes from each of the generated child nodes, assuming that N is two, and repeat generation of these child nodes recursively to generate a recursive tree structure. In either case, recursive division is performed so that the spokes are equally spaced with the number of leaf nodes of the generated tree structure.

The recursive tree may be stored in the storage 129 as a correspondence table (a look up table; hereinafter referred to as a LUT) in which the total number of spokes and N are associated with the second natural numbers and the spoke angles. The storage 129 may store the correspondences between an examination time for each imaging protocol (an acquisition time of MR signals), namely, an execution time of a planned pulse sequence, and the total number of spokes. In this case, if an examination time relative to the subject P is input by the operator's instruction through the interface circuitry 125, etc., the processing circuitry 131 determines the total number of spokes in accordance with the input examination time. The aforementioned determination of the total number of spokes is an example, and is not limited thereto. For example, the total number of spokes may be input by the operator's instruction through the interface circuitry 125. Next, the processing circuitry 131 sets a scanning order of spokes and an angle of each spoke, based on the total number of spokes and the LUT. For example, the processing circuitry 131 determines the number of spokes corresponding to signal acquisition along the radial directions in k-space, and angles between neighboring spokes in k-space, which are equal to each other, for example, by using the LUT. The processing circuitry 131 outputs the set scanning order and spoke angles to the sequence control circuitry 121. Since the total number of spokes is proportional to the examination time, the LUT may be a correspondence table where the examination time and N are associated with the second natural numbers and the spoke angles. In this case, the process to determine the total number of spokes in accordance with the examination time is unnecessary.

The processing circuitry 131 specifies, by activating the setting function 1315, spokes used for reconstruction of an MR image (one frame) (hereinafter, referred to as reconstruction spokes), based on the number of spokes used for reconstruction of an MR image, and the second natural numbers and the spoke angles assigned to the corresponding leaf nodes in the recursive tree. The number of spokes used for reconstruction of an MR image may be the same over a plurality of frames or different between frames. The reconstruction spokes for each of the frames may be discretionarily set or changed by the operator's instruction through the interface circuitry 125.

The number of spokes used for reconstruction of an MR image may be input by the operator's instruction through the interface circuitry 125, or by a default value stored in the storage 129. The default value is, for example, a value which has a natural number less than (j−1) as an exponent of N. For example, in the case where N is three, and the total number of spokes is 45, the storage 129 stores nine as a default value of the number of reconstruction spokes.

Specifically, the processing circuitry 131 specifies, by activating the setting function 1315, reconstruction spokes in such a manner that respective neighboring spokes define substantially equally spaced angles in k-space corresponding to one frame, by using the input number of spokes or the default value, and the recursive tree. The reconstruction spokes may be specified before executing a radial scan using the scanning order and the spoke angles in the recursive tree or after acquisition of MR data corresponding to all spokes.

The sequence control circuitry 121 acquires MR signals from each of N spokes where N is less than the total number of spokes, and thereafter acquires MR signals from each of the N spokes after the N spokes are rotated while maintaining angles between respective neighboring spokes. Specifically, the sequence control circuitry 121 controls the gradient magnetic field power supply 105, the transmitter circuitry 113, and the receiver circuitry 119 so as to acquire MR signals corresponding to spokes with the angles assigned to leaf nodes in the scanning order determined by the second natural numbers assigned to the leaf nodes in the recursive tree. That is, the sequence control circuitry 121 executes a radial scan by using the set scanning order and spoke angles.

Figure 4:
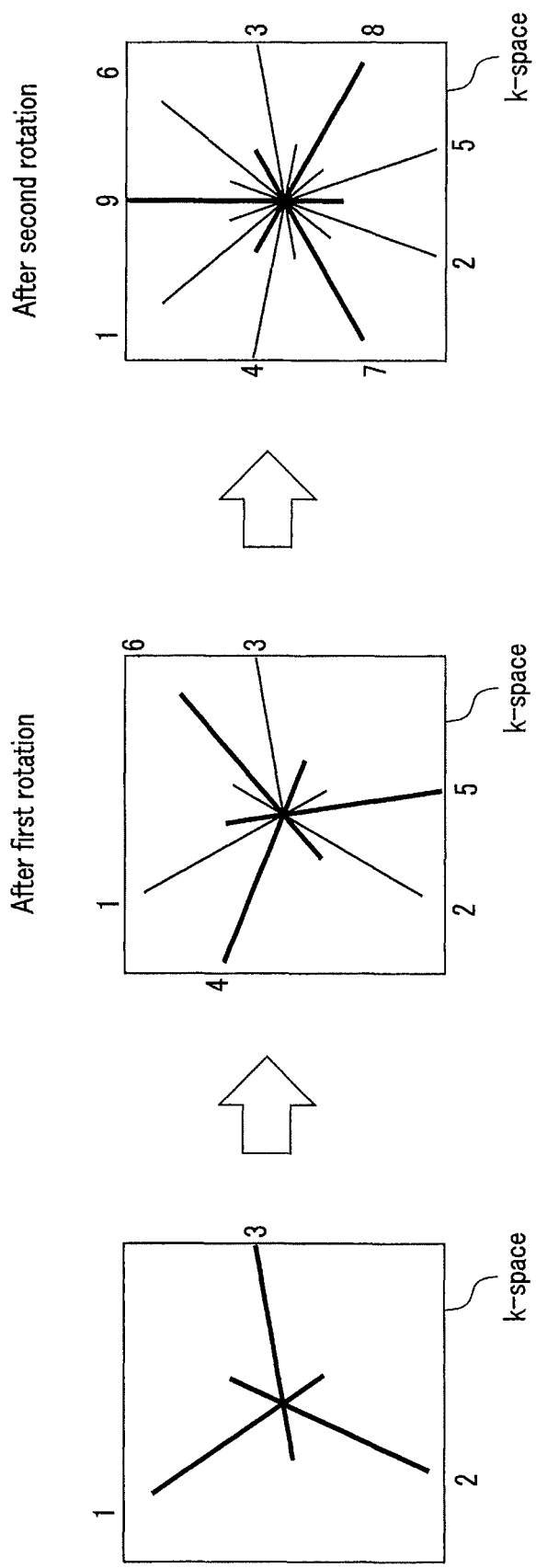
FIG. 4 is a diagram showing an example of a scanning order using the recursive tree shown in FIG. 2, according to the present embodiment.

FIG. 4 is a diagram showing an example of a scanning order using the recursive tree RT1 shown in FIG. 2. As shown in FIG. 4, a scan is performed in an order from one to nine of the second natural numbers assigned to the leaf nodes of the recursive tree RT1 shown in FIG. 2 until the second rotation of positions of three spokes has been performed. Specifically, a scan is first performed along a spoke at an angle of (360/9)×1, then performed along a spoke at an angle of (360/9)×4, and then performed along a spoke at an angle of (360/9)×7. Thereafter, the positions of the three spokes are rotated by an angle of a spoke corresponding to a leaf node to which the second natural number of four is assigned in the recursive tree RT1 relative to the reference axis in k-space. After the first rotation of the three spokes positions, a scan is performed along a spoke of an angle of (360/9)×2, then performed along a spoke at an angle of (360/9)×5, and then performed along a spoke at an angle of (360/9)×8. Thereafter, the three spokes positions are rotated by an angle of a spoke corresponding to a leaf node to which the second natural number of seven is assigned in the recursive tree RT1 relative to the reference axis. After the second rotation of the three spokes positions, a scan is performed along a spoke at an angle of (360/9)×3, then performed along a spoke at an angle of (360/9)×6, and then performed along a spoke at an angle of (360/9)×9.

Each of the spokes shown in FIG. 4 is described to extend from a position near a center of k-space to a position near the end of k-space, crossing the center of k-space. This indicates that a radial scan is performed along each of the spokes shown in FIG. 4 in which a delay of starting time of MR signal acquisition according to a rise time of the gradient field, reduction of time for acquisition of MR signals, reduction of an echo time (TE), etc. are accounted for. In the present embodiment, the path lengths of spokes are not limited to those indicated in FIG. 4. For example, a radial scan according to the present embodiment may be performed corresponding to spokes which cross the center of k-space and trajectories of which extend between opposed ends in k-space.

The processing circuitry 131 reconstructs, by activating the reconstruction function 1313, an MR image for each frame by using MR signals corresponding to spokes set by the setting function 1315 among acquired MR signals. For example, in FIG. 4, in the case where the number of spokes for each frame is set to be three, the processing circuitry 131 reconstructs a first MR image of a first frame by using MR data corresponding to spokes to which the second natural numbers of one to three are assigned. The processing circuitry 131 reconstructs a second MR image of a second frame by using MR data corresponding to spokes to which the second natural numbers of four to six are assigned. The processing circuitry 131 reconstructs a third MR image of a third frame by using MR data corresponding to spokes to which the second natural numbers of seven to nine are assigned.

[Operation]

Figure 5:
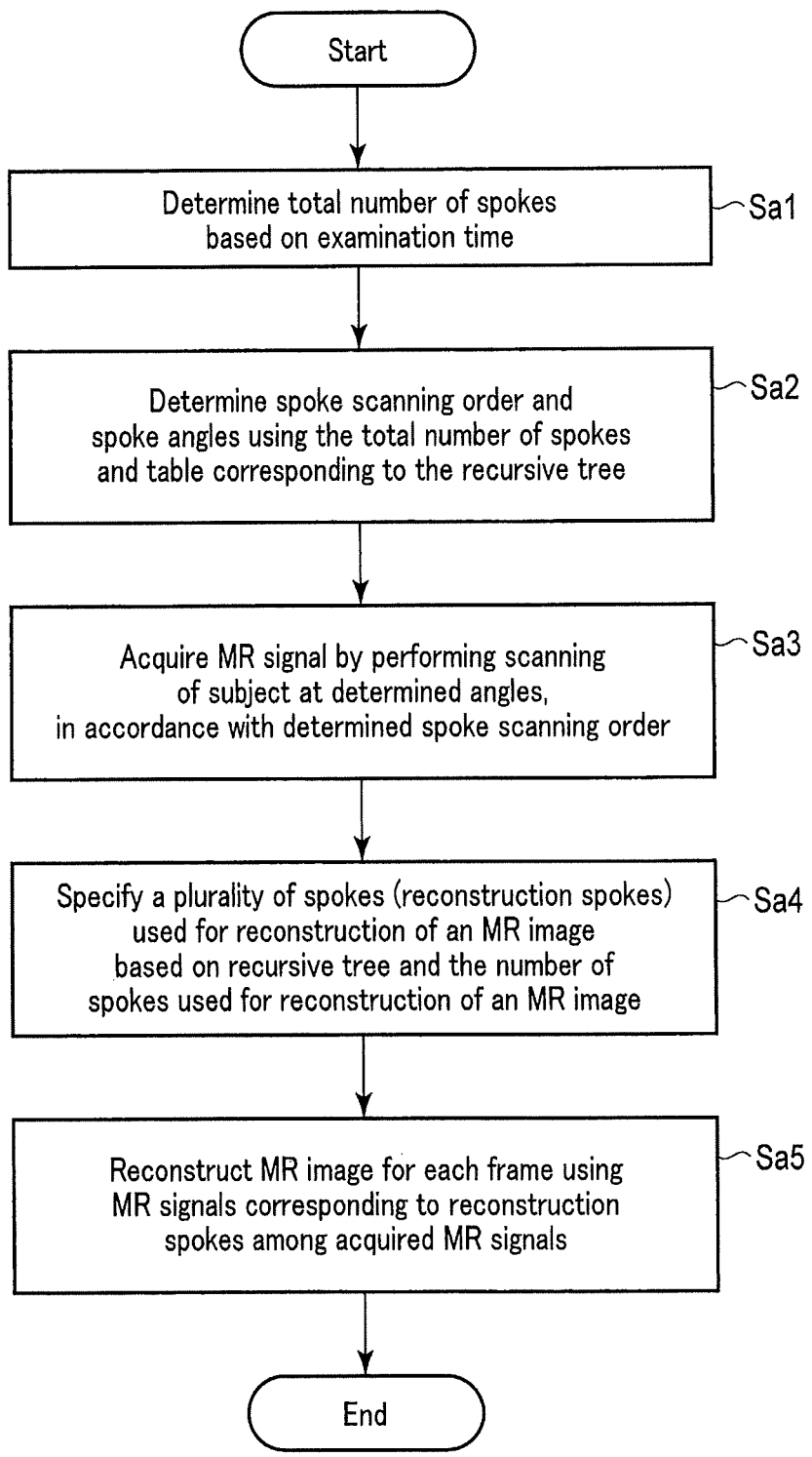
FIG. 5 is a flowchart showing an example of a process of an operation, according to the present embodiment.

FIG. 5 is a flowchart of an example process of an operation according to the present embodiment. It is assumed that a recursive tree is generated by the aforementioned process, and stored in the storage 129 as an LUT corresponding to the total number of spokes and N. In order to specifically explain the operation, it is assumed that N is three, and the total number of spokes in a radial scan is 45. In this case, the recursive tree is a tree structure where j=4, and $N^3=81$, in which leaf nodes are generated at a lower layer of the child nodes indicated as the lowest layer in FIG. 3.

(Step Sa1)

An examination time relative to a subject P is input through the interface circuitry 125. The examination time may be input to the MRI apparatus 100 from an external device such as a Radiology Information System (RIS), a Hospital Information System (HIS), etc. in a form of an examination order through a network. If the examination time is input, the total number of spokes is determined based on the examination time. In the case where the LUT corresponding to the recursive tree is stored in the storage 129 as a correspondence table in which an examination time is associated with a second natural number and an angle of spoke, this step is unnecessary.

(Step Sa2)

The scanning order (second natural numbers) and the spoke angle relative to each spoke are determined by using the total number of spokes and the LUT corresponding to the recursive tree. For example, in the case where the total number of spokes is 45, a LUT corresponding to a recursive tree where j=4 is read from the storage 129. Based on the read LUT and the total number of spokes, the scanning order of 45 spokes and an angle of each of the 45 spokes in k-space are determined. In the case where the LUT corresponding to the recursive tree is stored in the storage 129 as a correspondence table in which an examination time is associated with a second natural number and a spoke angle, the scanning order and spoke angle are determined based on the examination time in this step.

(Step Sa3)

By performing a scan on the subject P at the determined angles, in accordance with the determined spoke scanning order, an MR signal corresponding to each spoke is acquired. In the case where parallel imaging is performed, or compressed sensing is performed in addition to the parallel imaging in acquisition of MR signals and reconstruction of MR images, a scan for obtaining a sensitivity map indicating spatial sensitivity of a plurality of coil elements may be performed prior to, or subsequent to this step. Instead of performing the scan for obtaining the sensitivity map, the processing circuitry 131 may estimate a sensitivity map for each coil element by activating the reconstruction function 1313 to execute a non-uniform fast Fourier transformation (NUFFT) in accordance with the spokes relative to the MR data filled in k-space for each coil element.

Figure 6:
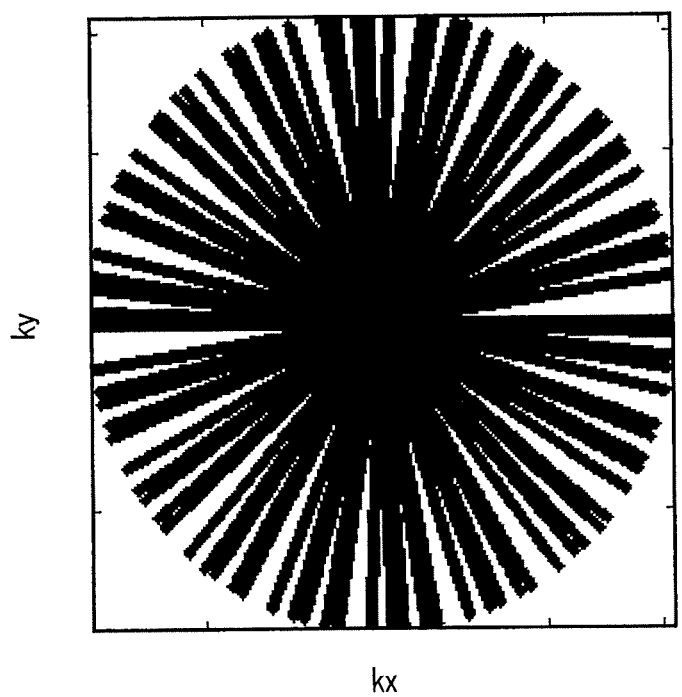
FIG. 6 is a diagram showing an example of a total of 45 spokes in k-space, according to the present embodiment.

FIG. 6 is a diagram showing an example of a total of 45 spokes in k-space. All of the 45 spokes shown in FIG. 6 are divided for each frame based on the recursive tree, by the process in step Sa4 described below.

(Step Sa4)

Figure 7:
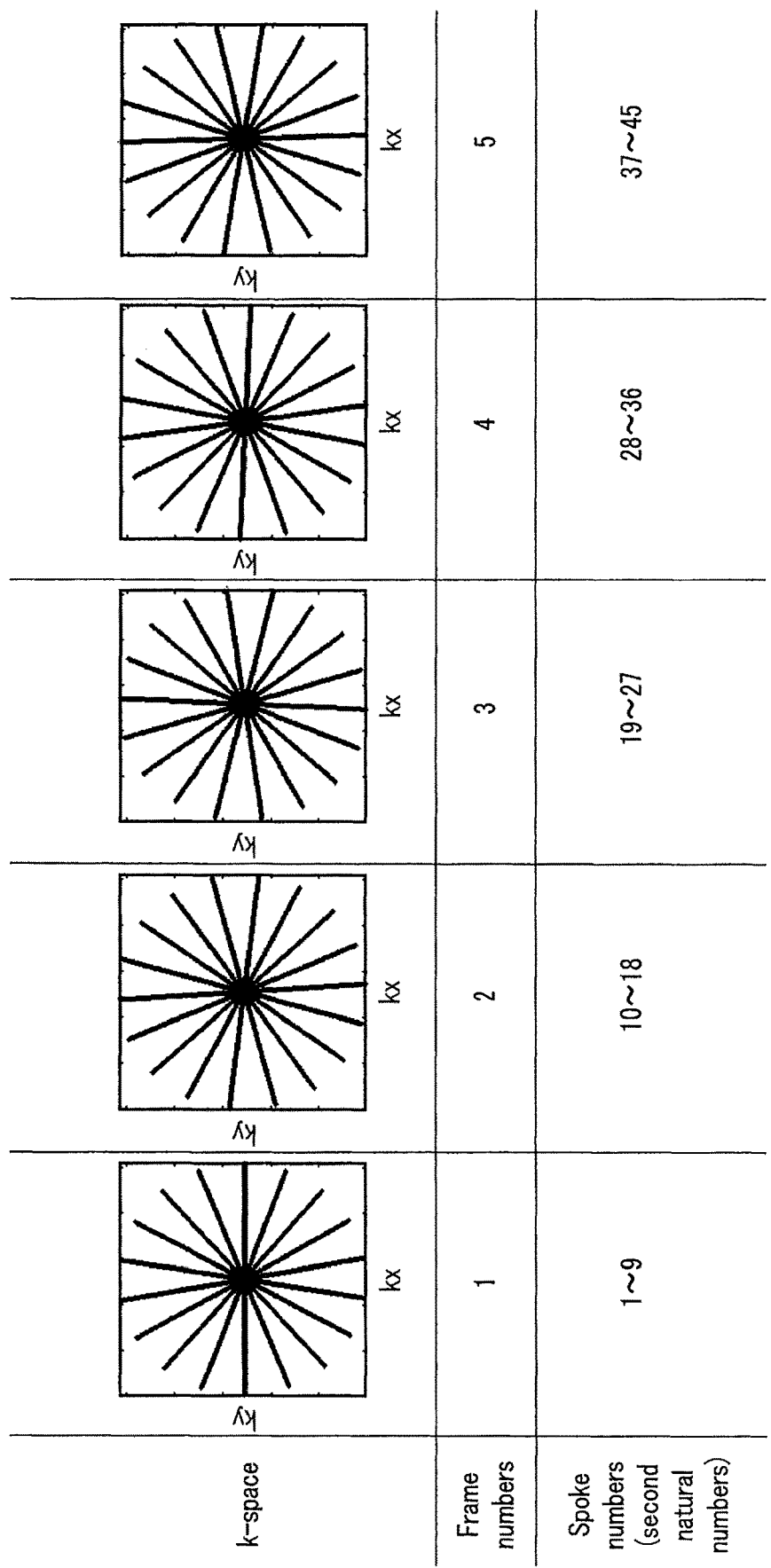
FIG. 7 is a diagram showing an example of reconstruction spokes specified for each frame, according to the present embodiment.

Based on the number of spokes input by the operator (or a default value) and the recursive tree, reconstruction spokes are specified. The case where the number of spokes used for reconstruction of an MR image is nine will be described in detail. FIG. 7 is a diagram showing an example of reconstruction spokes specified to each frame according to the present embodiment. Reconstructed spokes for the first frame as shown in FIG. 7 include nine spokes each corresponding to the leaf nodes to which the second natural numbers of one to nine are assigned. Similarly, reconstruction spokes for each of the second to fifth frames of FIG. 7 include nine spokes, each corresponding to the leaf nodes to which the second natural numbers of 10 to 18, 19 to 27, 28 to 36, and 37 to 45 are assigned.

As shown in FIG. 7, positions of reconstruction spokes in k-space for the first to fifth frames are set by the second natural numbers and the spoke angles in k-space assigned in the recursive tree so that already used spokes in the previous frames are not repeatedly used. In addition, nine spokes included in the reconstruction spokes for each of the first to fifth frames are set so that the neighboring spokes have equally spaced angles in k-space.

FIG. 7 shows an example where nine reconstruction spokes are specified for each of the five frames among a total of 45 spokes. However, the number of reconstruction spokes for each frame is not limited to be the same as shown in FIG. 7. For example, in order to improve the quality of reconstructed MR images, the processing circuitry 131 may specify, by activating the setting function 1315, reconstruction spokes for a frame by combining any spoke numbers in the first to fifth frames shown in FIG. 7.

Specifically, by the setting function 1315, the processing circuitry 131 may combine spoke numbers 1 to 18 in the first and second frames of FIG. 7 as reconstruction spokes for one frame, combine spoke numbers 10 to 27 in the second and third frames of FIG. 7 as reconstruction spokes for the next frame, combine spoke numbers 19 to 36 in the third and fourth frame of FIG. 7 as reconstruction spokes for the next frame, and combine spoke numbers 28 to 45 in the fourth and fifth frames of FIG. 7 as reconstruction spokes for the last frame. As another example, the processing circuitry 131 may combine spoke numbers 1 to 27 in the first to third frames of FIG. 7 as reconstruction spokes for one frame, combine spoke numbers 10 to 36 in the second to fourth frames of FIG. 7 as reconstruction spokes for the next frame, and combine spoke numbers 19 to 45 in the third to fifth frame of FIG. 7 as reconstruction spokes for the last frame.

As another example, by the setting function 1315, the processing circuitry 131 may combine spoke numbers 1 to 27 in the first to third frames of FIG. 7 as reconstruction spokes for one frame, and combine spoke numbers 19 to 45 in the third to fifth frame of FIG. 7 as reconstruction spokes for the last frame. As another example, the processing circuitry 131 may combine spoke numbers 1 to 36 in the first to fourth frames of FIG. 7 as reconstruction spokes for one frame, and combine spoke numbers 10 to 45 in the second to fifth frames of FIG. 7 as reconstruction spokes for the last frame. As another example, the processing circuitry 131 may specify reconstruction spokes for the second and subsequent frames in FIG. 7 by the cumulative addition of spokes included in the reconstruction spokes in the previous frames, in order to progressively improve the quality of reconstructed MR images while maintaining time resolution. In addition, the processing circuitry 131 may specify all of the 45 spokes as reconstruction spokes for one frame, as shown in FIG. 6. The number of the reconstruction spokes may be changed for each frame, in accordance with a temporal change due to a contrast agent, a heartbeat, respiration, etc. For example, in the case where holding of the breath is performed as long as possible at first during a radial acquisition time (for example, one minute), it may be possible to use spoke numbers 1 to 9 for the first frame, use spoke numbers 10 to 18 for the second frame, and use 18 spokes for each frame after holding of the breath ends.

(Step Sa5)

An MR image is reconstructed for each frame by using MR signals corresponding to the specified spokes (reconstruction spokes) among MR signals acquired by the radial scan. For example, the processing circuitry 131 performs, by activating the reconstruction function 1313, gridding relative to MR data corresponding to each of the reconstruction spokes for each frame. Specifically, the processing circuitry 131 converts MR data in a non-orthogonal coordinate system corresponding to the reconstruction spokes into MR data in an orthogonal coordinate system. The processing circuitry 131 reconstructs MR images corresponding to the plurality of frames by executing a Fourier transform to the converted MR data in the orthogonal coordinate system.

In the case where MR signals are acquired by a radial scan using parallel imaging, the processing circuitry 131 reconstructs, by activating the reconstruction function 1313, MR images corresponding to temporally sequential frames by using the sensitivity map, and MR signals corresponding to the reconstruction spokes. In the case where compressed sensing is used in addition to parallel imaging, the processing circuitry 131 reconstructs MR images corresponding to temporally sequential frames by minimizing a cost function $E(x)$, given as follows:

$$E(x) = \frac{1}{2} \times \|F \cdot S \cdot x - b\|_2 + \lambda \times \|T \cdot x\|_1,$$

where x is a pixel value of an MR image corresponding to each of the temporally sequential frames, F is an operator that executes a non-uniform fast Fourier transformation (NUFFT) defined by reconstruction spokes, S is a sensitivity map of a plurality of coil elements, b is MR data of reconstruction spokes corresponding to the coil elements, $\lambda$ is a regular parameter for controlling a trade-off between consistency and sparsity of MR data by the parallel imaging, T is an operator that executes temporal total variance, $\|\ldots\|_1$ is L1 norm, and $\|\ldots\|_2$ is L2 norm.

The reconstructed MR image is displayed on the display 127 under control of the processing circuitry by the system control function 1311. In this case, the parameter concerning the recursive tree, reconstruction spokes as shown in FIG. 7, spoke distribution for each frame, etc. may be displayed along with the MR image. The operator can confirm the spoke distribution in k-space.

According to the above-described configuration, the following advantageous effects can be obtained.

According to the MRI apparatus 100 of the present embodiment, the sequence control circuitry 121 (acquisition unit) that acquires MR signals corresponding to the spokes along radial directions in k-space, acquires an MR signal corresponding to each of N spokes that are less than the total number of spokes, and then acquires an MR signal corresponding to each of the N spokes rotated while maintaining the angles between the neighboring spokes of the N spokes.

In addition, the MRI apparatus 100 can set N spokes in such a manner that respective neighboring spokes define equally spaced angles in k-space. For example, the MRI apparatus 100 can generate a tree structure which is a balanced tree and a multi-branch tree of N as a recursive tree which is recursive division, based on the total number of spokes and N in a radial scan. For example, the MRI apparatus 100 can set N parent nodes at a lower layer of a root node in the tree structure, set N child nodes for each parent node by N branches at a lower layer of the parent nodes, recursively set child nodes for each child node (j−2) times by branches at a lower layer of the firstly set child nodes, assign first natural numbers of one to N to the parent nodes in the ascending order, assigns from the left side in the ascending order, to N child nodes under the same parent node in which the number of connection branches between the parent node and each of the N child nodes is i (i is a natural number less than j), the first natural number of the corresponding parent node and (N−1) natural numbers obtained by sequentially adding $N^i$ to the first natural number and to the resultant value, the addition of $N^i$ being repeated (N−1) times, and can assign in the ascending order values obtained by dividing 360° by the total number of spokes and multiplying the resultant values by a number of one to N, respectively, to each of leaf nodes which are child nodes at the lowest level of the tree structure as spoke angles in k-space, to generate the recursive tree. That is, the MRI apparatus 100 can assign different natural numbers and different spoke angles in k-space to each leaf node at the lowest level of the tree structure. Accordingly, the MRI apparatus 100 acquires MR signals corresponding to spokes at the spoke angles assigned to the leaf nodes, in the scanning order according to the second natural numbers assigned to the leaf nodes, by using the generated recursive tree.

In addition, the MRI apparatus 100 can reconstruct an MR image for each frame by specifying spokes used for reconstruction based on the number of spokes used for reconstruction for one magnetic resonance image, and the second natural numbers and spoke angles assigned to the leaf nodes, and using MR signals corresponding to the specified spokes among the acquired MR signals. Furthermore, the MRI apparatus 100 can reconstruct MR images along the temporal sequence by a reconstruction method which includes parallel imaging or compressed sensing.

Accordingly, the MRI apparatus 100 according to the present embodiment can set spokes in a radial scan so as to have equally spaced angles in k-space without repeatedly using already-used spokes. In particular, in the case where the number of spokes in each of the frames is an exponentiation of N, the MRI apparatus 100 can set spokes so that respective neighboring spokes define equally spaced angles without repeatedly using already used spokes in the previous frames over all the frames. As can be seen from the above, the MRI apparatus 100 according to the present embodiment can improve the quality of the reconstructed MR images.

(Modification)

The modification is different from the aforementioned embodiment in that the number of spokes for each frame is set without using a recursive tree, and the positions of spokes in k-space are determined so that respective neighboring spokes define equally spaced angles in accordance with the set number of spokes.

The processing circuitry 131 sets, by activating the setting function 1315, the number of spokes for each frame in response to the operator's instruction through the interface circuitry 125, for example. The number of spokes for a frame may be stored in the storage 129 as a default value. The processing circuitry 131 calculates angles between neighboring spokes in a frame by dividing 360° by the set number of spokes. The processing circuitry 131 sets positions of spokes in an initial frame (hereinafter, referred to as initial spoke positions) to which a radial scan is performed, based on the calculated angles in k-space. The processing circuitry 131 determines a rotation angle to rotate the initial spoke positions in accordance with the number of frames by dividing the calculated angles between spokes by the total number of frames.

The rotation angle may be generated, for example, by a non-illustrated random number generator within a range of the calculated angles between spokes.

The sequence control circuitry 121 controls the gradient magnetic field power supply 105, the transmitter circuitry 113, and the receiver circuitry 119, etc. in a manner that a radial scan is performed relative to the initial spoke positions to acquire MR signals for the initial frame. If a radial scan is performed for the initial frame, the sequence control circuitry 121 performs a radial scan at positions of spokes rotated from the initial spoke positions by the rotation angle. Similarly, the sequence control circuitry 121 performs a radial scan by rotating the initial spoke positions frame by frame until MR signals for all frames have been acquired.

Figure 8:
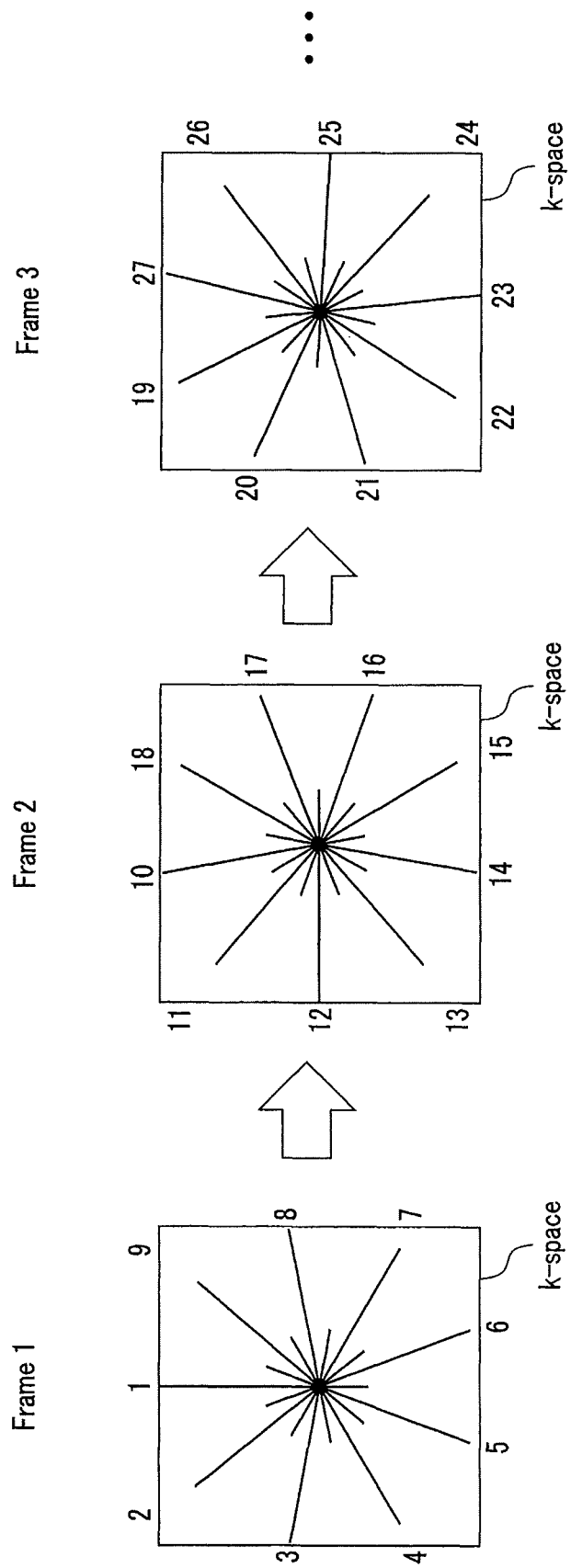
FIG. 8 is a diagram showing an example where the initial spoke positions are rotated frame by frame in the case where the number of spokes for each frame is nine, according to a modification of the present embodiment.

FIG. 8 is a diagram showing an example where the initial spoke positions are rotated frame by frame in the case where the number of spokes for each frame is nine. In FIG. 8, frame 1 corresponds to the initial frame. As shown in FIG. 8, the initial spoke positions are rotated frame by frame, and a radial scan is performed at the spoke positions after rotation. As shown in FIG. 8, the spokes are distributed with equally spaced angles in each of the frames.

Figure 9:
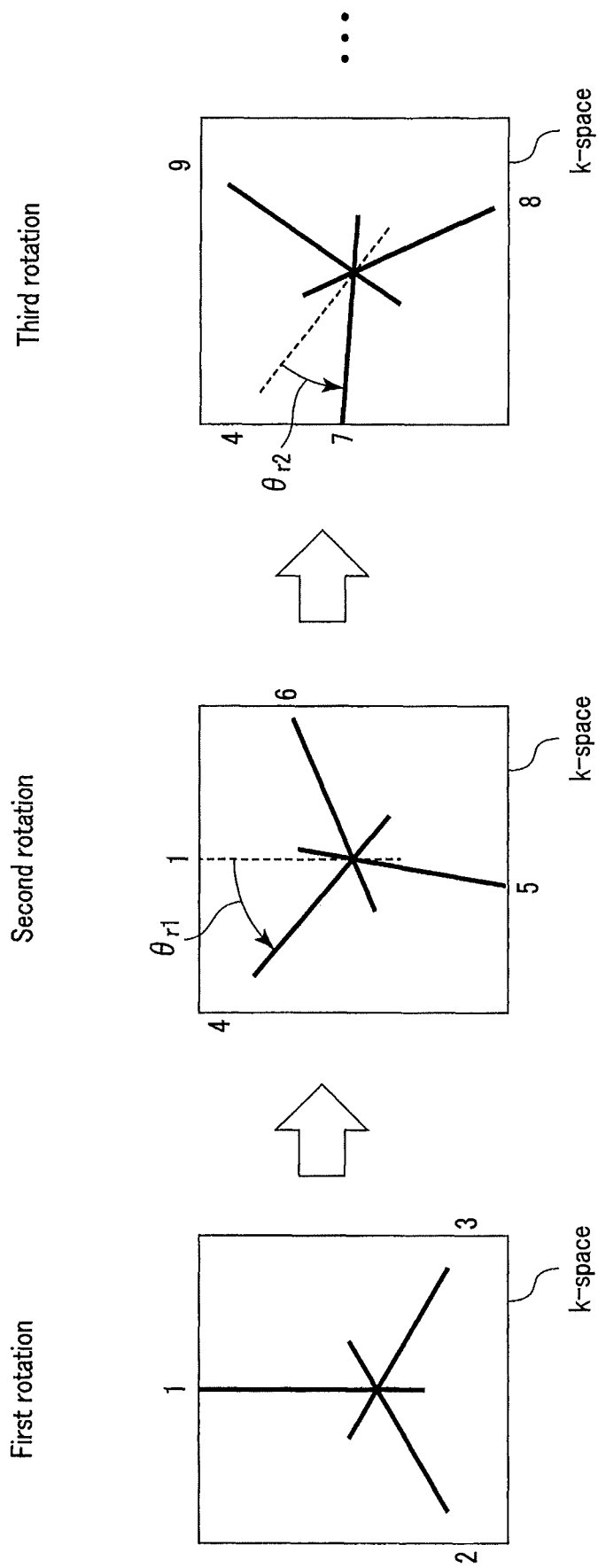
FIG. 9 is a diagram showing an example where a radial scan is performed by randomly rotating the initial spoke positions, according to a modification of the present embodiment.

FIG. 9 is a diagram showing an example where a radial scan is performed by randomly rotating initial spoke positions. As shown in FIG. 9, after a first radial scan, the initial spoke positions are rotated by a randomly generated rotation angle $\theta_{r1}$, and the second radial scan is performed. Then, after the second radial scan, the rotated initial spoke positions are further rotated by a randomly generated rotation angle $\theta_{r2}$, and the next radial scan is performed. The radial scans are performed by rotating initial spoke positions frame by frame until MR signals corresponding to all spokes are acquired.

According to the above-described configuration, the following advantageous effects can be obtained.

The MRI apparatus 100 according to the modification can set the number of spokes for a frame, determine positions of spokes in k-space so that respective neighboring spokes define equally spaced angles in accordance with the set number of spokes, and perform a radial scan by rotating the determined spoke positions by a rotation angle. Accordingly, the MRI apparatus 100 according to the modification can set spokes in a radial scan so as to define equally spaced angles in k-space. That is, the MRI apparatus 100 can improve the quality of MR images by setting spokes so as to define equally spaced angles in all frames.

In addition, the reconstruction function 1313, the setting function 1315, etc. in the embodiment and modification can also be implemented by installing a program (a data acquisition program) that executes these functions in a computer of the MRI apparatus 100, and deploying these functions in a memory. In this case, the data acquisition program causes the computer to generate a recursive tree, and perform a radial scan. The program that causes a computer to execute the above method can be stored and distributed on various types of portable storage medium such as a magnetic disc, an optical disc, or a semiconductor memory.

According to the MRI apparatus 100 in the aforementioned embodiment and modification, etc., the quality of MR images can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
sequence control circuitry that acquires a magnetic resonance signal corresponding to each of a plurality of spokes along a plurality of radial directions in k-space, wherein the sequence control circuitry:
acquires a magnetic resonance signal corresponding to each of N spokes, where N is a natural number of two or more and is less than a total number of the spokes; and
thereafter acquires a magnetic resonance signal corresponding to each of the N spokes after the N spokes are rotated while maintaining angles between respective neighboring spokes; and processing circuitry that sets the N spokes so that the angles between the respective neighboring spokes are equal in k-space, wherein the processing circuitry
  sets a rotation angle of the N spokes in k-space by performing recursive division to 360° by an exponentiation of the N so that the angles between the respective neighboring spokes are equal,
  generates a tree structure which is a balanced tree and a multi-branch tree of the N, based on the total number of spokes and the N, as the recursive division, and
  assigns different natural numbers and different spoke angles in k-space to each of leaf nodes at a lowest layer of the tree structure.

2. The apparatus according to claim 1, wherein N is an odd number.

3. The apparatus according to claim 1, wherein N is three.

4. The apparatus according to claim 1, wherein the sequence control circuitry acquires the magnetic resonance signal corresponding to each of spokes at the angles assigned to the leaf nodes in a scanning order, according to the natural numbers assigned to the leaf nodes.

5. The apparatus according to claim 1, wherein the processing circuitry:
  specifies a plurality of spokes used for reconstruction of a magnetic resonance image based on a number of spokes used for the reconstruction, and the natural numbers and the angles assigned to the leaf nodes; and
  reconstructs a magnetic resonance image for each frame by using magnetic resonance signals corresponding to the specified spokes among the acquired magnetic resonance signals.

6. The apparatus according to claim 1, wherein the sequence control circuitry randomly rotates the N spokes.

7. A magnetic resonance imaging apparatus comprising:
processing circuitry that sets an angle for each of a plurality of spokes along a plurality of radial directions in k-space; and
sequence control circuitry that acquires a magnetic resonance signal for the plurality of spokes,
wherein the processing circuitry assigns an angle of each spoke of the plurality of spokes based on a tree structure which is a multi-branch tree having N nodes connected to a root node, the N being a natural number equal to or larger than two and being smaller than a total number T of the plurality of spokes, the tree structure having a number M of nodes off of each of the N nodes and having T leaf nodes at a lowest level of the tree structure,
wherein the angle for each of the plurality of spokes corresponds to one of the T leaf nodes of the tree structure that corresponds in degrees to a multiple of (360/T) multiplied by one of a natural number index from 1 to T,
wherein the T leaf nodes of the tree structure are grouped into groups of M leave nodes each in sequential order by angle, and
wherein an order of the plurality of spokes is selected such that a leaf node of the T leaf nodes having a smallest angle is first selected from each group in ascending order before a leaf node of the T leaf nodes having a next smallest angle is selected from each group until all leaf nodes from all T leaf nodes have been selected.

* * * * *